(12) United States Patent
Woo et al.

(10) Patent No.: US 6,506,668 B1
(45) Date of Patent: Jan. 14, 2003

(54) UTILIZATION OF ANNEALING ENHANCED OR REPAIRED SEED LAYER TO IMPROVE COPPER INTERCONNECT RELIABILITY

(75) Inventors: Christy Mei-Chu Woo, Cupertino, CA (US); Connie Pin-Chin Wang, Menlo Park, CA (US); Steve C. Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/887,148

(22) Filed: Jun. 22, 2001

(51) Int. Cl.[7] .................. H01L 21/3205; H01L 21/44
(52) U.S. Cl. .................. 438/584; 438/648; 438/653; 438/687
(58) Field of Search .................. 438/653, 648, 438/584, 678, 681, 637, 687; 257/751, 752, 764

(56) References Cited

U.S. PATENT DOCUMENTS

| | | | |
|---|---|---|---|
| 4,810,332 A | | 3/1989 | Pan ................ 204/15 |
| 5,071,518 A | | 12/1991 | Pan ................ 205/122 |
| 5,592,024 A | | 1/1997 | Aoyama et al. ............. 257/751 |
| 5,670,420 A | | 9/1997 | Choi ................ 437/189 |
| 5,898,222 A | | 4/1999 | Farooq et al. ............. 257/762 |
| 5,969,422 A | | 10/1999 | Ting et al. ................ 257/762 |
| 6,096,648 A | * | 8/2000 | Lopatin et al. ............. 438/618 |
| 6,103,624 A | * | 8/2000 | Nogami et al. ............. 438/257 |
| 6,123,825 A | | 9/2000 | Uzoh et al. ................. 205/183 |
| 6,126,806 A | * | 10/2000 | Uzoh ........................ 205/157 |
| 6,181,012 B1 | | 1/2001 | Edelstein et al. ........... 257/762 |
| 6,184,137 B1 | * | 2/2001 | Ding et al. ................. 438/687 |
| 6,197,181 B1 | * | 3/2001 | Chen ......................... 204/198 |
| 6,221,765 B1 | * | 4/2001 | Ueno ......................... 438/584 |
| 6,235,406 B1 | * | 5/2001 | Uzoh ......................... 205/157 |
| 6,242,349 B1 | * | 6/2001 | Nogami et al. ............. 205/184 |
| 6,277,263 B1 | * | 8/2001 | Chen ......................... 205/170 |
| 6,281,110 B1 | * | 8/2001 | Kizilyalli et al. ............ 438/622 |
| 6,303,486 B1 | * | 10/2001 | Park ........................... 257/374 |
| 6,387,805 B2 | * | 5/2002 | Ding et al. ................. 438/629 |
| 2001/0029099 A1 | * | 10/2001 | Ho et al. ..................... 438/637 |

FOREIGN PATENT DOCUMENTS

EP   1069213 A2 *  1/2001  ............ C25D/5/50

* cited by examiner

*Primary Examiner*—Michael S. Lebentritt
(74) *Attorney, Agent, or Firm*—Renner, Otto, Boisselle & Sklar, LLP

(57) ABSTRACT

A method of forming interconnects on a semiconductor chip is disclosed which comprises the steps of: depositing a barrier layer and a copper seed layer on the semiconductor chip; depositing on the copper seed layer an enhancement layer; annealing the semiconductor chip a first time after the copper seed layer and the enhancement layer are deposited to form an annealed layer; electroplating a copper layer on the semiconductor chip; and annealing the semiconductor chip a second time after the copper layer is deposited on the annealed layer to form an annealed copper conductive layer.

19 Claims, 5 Drawing Sheets

US 6,506,668 B1

UTILIZATION OF ANNEALING ENHANCED OR REPAIRED SEED LAYER TO IMPROVE COPPER INTERCONNECT RELIABILITY

FIELD OF THE INVENTION

The invention herein described relates generally to the fabrication of conductive interconnects and the filling of vias in semiconductor chips. More particularly, the invention relates to a method of using copper to interconnect integrated circuit component parts in conjunction with a dielectric constant material used as a gap filler.

BACKGROUND OF THE INVENTION

The need for high performance semiconductor chips has continued to increase over the past several years. As the demand for better performance and faster semiconductor chips increases, so does the effort to reduce the size of semiconductor chips. Reducing the size of individual integrated circuit component parts can dramatically increase the speed and performance of a semiconductor chip. For example, smaller gate lengths in MOS transistors dramatically increases the switching speed of MOS transistors. The performance of semiconductor chips is limited by the electrical conductivity of the metal interconnects which electrically connect the various component parts that are contained in integrated circuits on the semiconductor chip. Therefore, in order to take full advantage of transistors capable of operating at faster speeds the electrical interconnects must be highly conductive, yet low in resistance.

In prior art metallization processes, aluminum or an aluminum alloy, was widely used as the preferred metallization metal. Metallization is the term used in the semiconductor industry to generally describe the process of "wiring" the component parts of an integrated circuit together. Aluminum emerged as the preferred metal for metallization because it has a relatively low resistivity (2.7 $\mu\Omega$/cm), a good current-carrying density, superior adhesion to silicon dioxide qualities, is available in high purity and has a natural low contact resistance with silicon. However, aluminum and aluminum alloys suffer from eutectic formations, thermally induced voiding and electromigration when used in very large scale integration (VLSI) and ultra large scale integration (ULSI) semiconductor chips.

Copper metal has begun to replace aluminum and aluminum-silicon alloys in VLSI and ULSI metallization because it has better conductivity and is more reliable than other metals, such as aluminum and aluminum alloys. The use of electroplating techniques for performing metallization using copper is especially appealing because of low cost, high throughput, high quality of the deposited copper film and excellent via filling capabilities. Although aluminum has a resistance that can be tolerated by most integrated circuits, it is difficult to deposit in a high aspect ratio. Copper is capable of being deposited with high aspect ratios. Copper is also a much better conductor than aluminum, provides good step coverage, is more resistant to electromigration and can be deposited at low temperatures. However, copper will still diffuse into silicon if applied directly to the silicon without first applying a barrier layer between the silicon layer and the copper layer.

Damascene is an interconnection fabrication process in which grooves are formed in an insulating layer and filled with metal to form the conductive lines that interconnect the component parts of the integrated circuit. Dual damascene is a multi-level interconnection process in which via openings are formed in addition to forming the grooves of single damascene. Conductive lines are then deposited that interconnect the active and passive elements of the integrated circuit contained on the semiconductor chip.

A current method of forming a copper interconnect consist of the steps shown in FIGS. 1–6. Referring to FIG. 1, a cross-sectional view of a portion of a semiconductor chip 100 is illustrated which includes a substrate layer 102 and an overlying dielectric layer 104. As known in the art, the semiconductor chip 100 at this particular stage of manufacturing may include a variety of integrated circuit component parts that were formed during previously completed fabrication steps. The dielectric layer 104 is deposited on the surface of the substrate layer 102 using methods known in the art, such as chemical vapor deposition (CVD), plasma enhanced chemical vapor deposition (PECVD), spin on depositing or by thermal oxidation. The dielectric layer 104 can be selected from a variety of dielectric materials known to those in the art.

Next, as is illustrated in FIG. 2, the dielectric layer 104 is patterned using techniques known in the art to yield a patterned dielectric layer having patterned dielectric features 104a and openings 106. As is illustrated in FIG. 3, once the dielectric layer 104 has been deposited and patterned accordingly, a barrier layer 108 is deposited on the patterned dielectric layer 104a. Materials used for the barrier layer 108 may be selected from several materials known in the art for providing a sufficient barrier between the substrate layer 102 and the metal deposited during the metallization process. The barrier layer 108 is deposited on the semiconductor chip 100 using several deposition techniques known in the art such as evaporation, chemical vapor deposition (CVD), plasma enhanced chemical vapor deposition (PECVD), physical vapor deposition (PVD), ion-metal plasma (IMP), hollow cathode magnetron (HCM) or sputter ion plating (SIP).

The next layer deposited on the semiconductor chip 100 is a copper seed layer 110. Like the barrier layer 108, the copper seed layer 110 may be deposited on the semiconductor chip 100 using deposition techniques known in the art such as evaporation, IMP, CVD, PVD, HCM, SIP or PECVD. After the deposition of both the barrier layer 108 and the copper seed layer 110, a copper layer 112 is electrodeposited by electroplating so as to over fill the openings 106 as illustrated in FIG. 4. This entire structure is then subjected to annealing, as known in the art, in a nitrogen ($N_2$) or forming gas atmosphere to yield a semiconductor 100 having an annealed layer 114 as illustrated in FIG. 5. Finally, as is illustrated in FIG. 6, the excess copper of annealed layer 114 and the excess barrier layer 108 is remove to a suitable depth so as to yield copper interconnects 114a bound by the barrier layers 108a. The removal of the excess copper of layer 114 and the barrier layer 108 can be accomplished by any suitable method such as chemical mechanical polishing (CMP).

Although the above method generally yields suitable interconnects, the method suffers from one or more of the following shortcomings. First, post plating annealing leads to copper grain growth. Such grain growth is associated with copper volume changes which in turn can lead to void formation when a volume change occurs within a confined metal feature. Second, during the above-mentioned method it is difficult to control and/or improve copper texture. Third, the above-mentioned method makes it difficult to control the stress value of and/or relieve the stress in a copper layer.

Accordingly, a need exists in the semiconductor industry for methods of reducing electromigration in semiconductor devices. In addition, a need exists for a method of which permits the deposition of a copper conductive layer with a low stress value, a strongly face-centered cubic <111> oriented copper lines and via structures, and an improved copper texture. Also, a method is needed which allows for control or modification of the stress value and/or copper texture in a copper conductive layer. This is because strong texture and low stress copper improves reliability. Whereas good copper texture helps to slow copper migration through grain boundaries. Additionally, low stress also retards the onset of void formation.

SUMMARY OF THE INVENTION

The present invention relates generally to the fabrication of conductive interconnects and the filling of vias in semiconductor chips. More particularly, the invention relates to a method of using copper to interconnect integrated circuit component parts in conjunction with a dielectric constant material used as a gap filler.

According to one aspect of the invention, a method of forming interconnects on a semiconductor chip is disclosed which comprises the steps of: depositing a barrier layer and a copper seed layer on the semiconductor chip; depositing on the copper seed layer an enhancement layer; annealing the semiconductor chip a first time after the copper seed layer and the enhancement layer are deposited to form an annealed layer; electroplating a copper layer on the semiconductor chip; and annealing the semiconductor chip a second time after the copper layer is deposited on the annealed layer to form an annealed copper conductive layer.

According to another aspect of the invention, a method of forming interconnects on a semiconductor chip is disclosed which comprises the steps of: depositing a barrier layer and a copper seed layer on the semiconductor chip; depositing on the copper seed layer an enhancement layer; annealing the semiconductor chip a first time after the copper seed layer and the enhancement layer are deposited to form an annealed layer; electroplating a copper layer on the semiconductor chip; annealing the semiconductor chip a second time after the copper layer is deposited on the annealed layer to form an annealed copper conductive layer; and planarizing the annealed copper conductive layer and the barrier layer, wherein at least one of the copper seed layer, the enhancement layer or the copper layer is composed of a copper alloy.

According to yet another aspect of the invention, a method of forming interconnects on a semiconductor chip is disclosed which comprises the steps of: depositing a dielectric layer onto a substrate of the semiconductor chip; patterning the dielectric layer to yield a patterned dielectric layer; depositing a barrier layer and a copper seed layer on the patterned dielectric layer; depositing on the copper seed layer an enhancement layer; annealing the semiconductor chip a first time after the copper seed layer and the enhancement layer are deposited to form an annealed layer; electroplating a copper layer on the semiconductor chip; annealing the semiconductor chip a second time after the copper layer is deposited on the annealed layer to form an annealed copper conductive layer; and removing at least one portion of the annealed copper conductive layer and the barrier layer that overlay the patterned dielectric layer.

Due in part to the above methods, the present inventive methods permit fabrication of semiconductor devices with reduce electromigration in the layers contained therein. Additionally, the present inventive methods permit the deposition of conductive layers with low stress values, strongly face-centered cubic <111> oriented copper lines and via structures, and improved copper texture. Also, the present inventive methods allow for control or modification of the stress value and/or copper texture in a copper conductive layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

The present invention relates generally to the fabrication of conductive interconnects and the filling of vias in semiconductor chips. More particularly, the invention relates to a method of using copper to interconnect integrated circuit component parts in conjunction with a dielectric constant material used as a gap filler. Additionally, it should be noted that in the following text, range limits may be combined.

Figure 1:
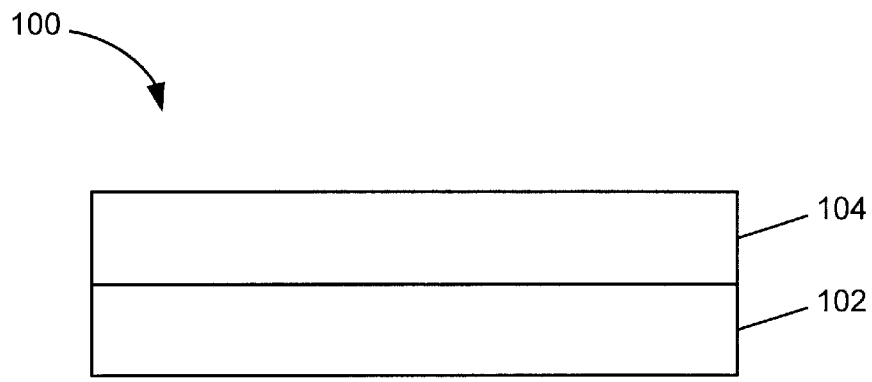
FIGS. 1–6 are cross-sectional schematic views illustrating some of the steps of a conventional method for producing a semiconductor device 100 having conductive interconnects.
Figure 2:
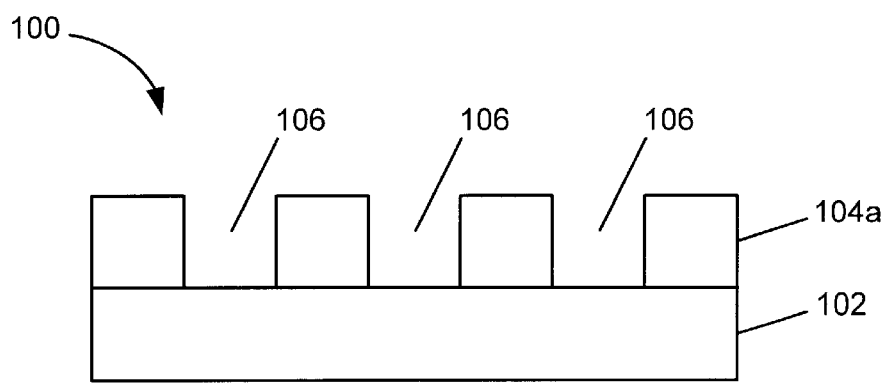
Figure 3:
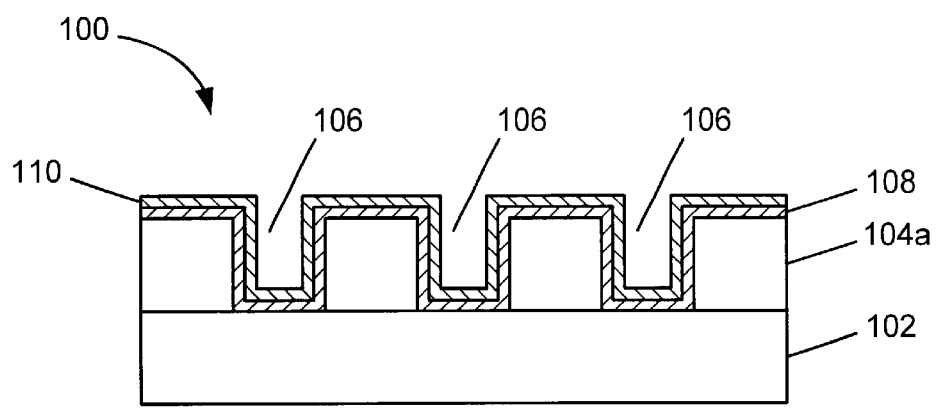
Figure 4:
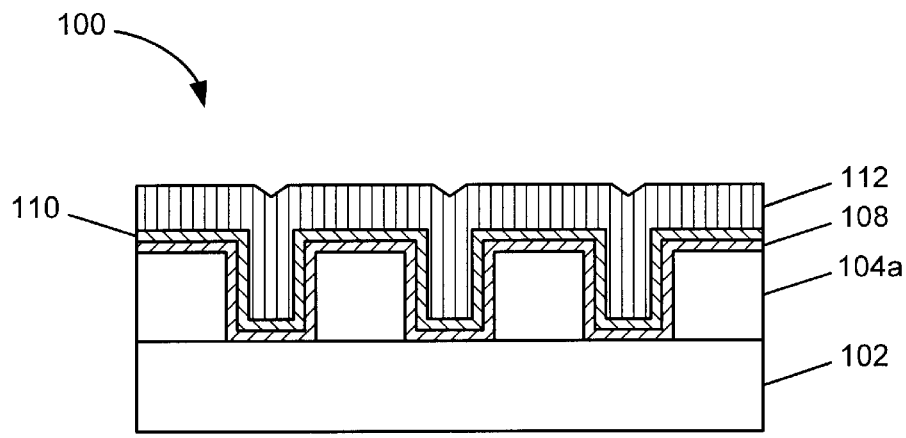
Figure 5:
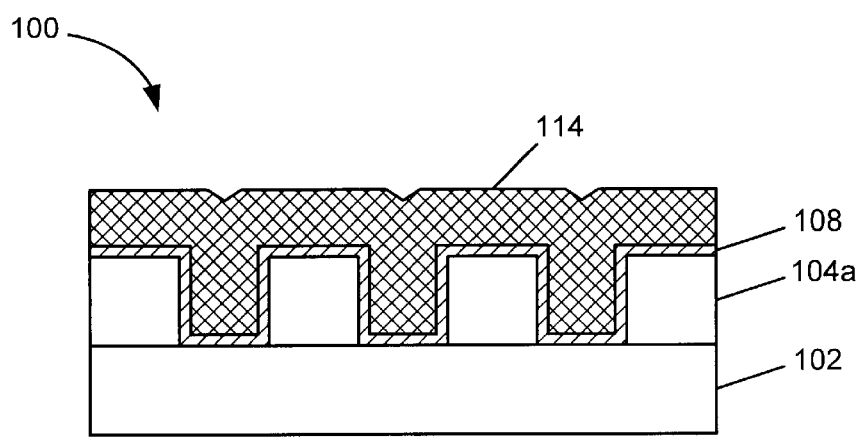
Figure 6:
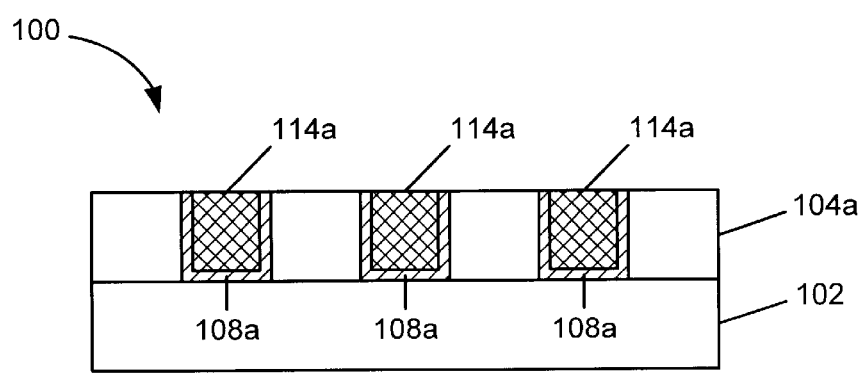
Figure 7:
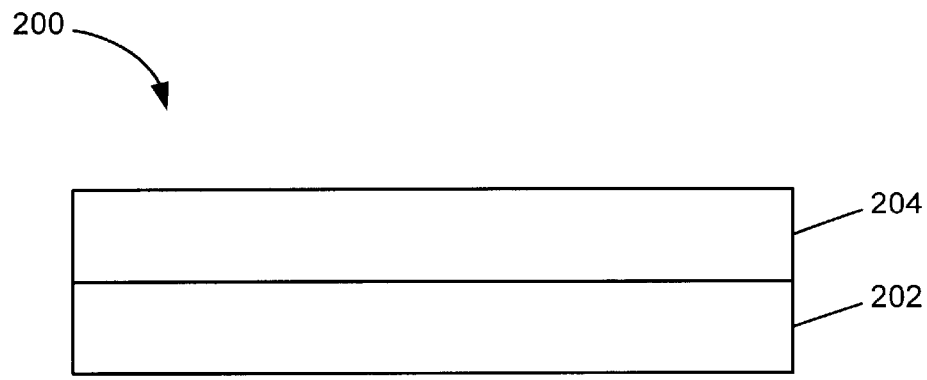
FIGS. 7–14 are cross-sectional schematic views illustrating some of the steps of one method in accordance with the present invention for producing a semiconductor device 200 having conductive interconnects.

Referring initially to FIG. 7, a cross-section view of a portion of a semiconductor chip 200 is illustrated, which includes a substrate layer 202 and an overlying dielectric layer 204. As known in the art, the semiconductor chip 200, at this particular stage of manufacturing, includes a variety of integrated circuit component parts that were formed during previously completed fabrication steps. The dielectric layer 204 is deposited on the surface of the substrate layer 202 using methods known in the art, such as chemical vapor deposition (CVD), plasma enhanced chemical vapor deposition (PECVD), spin on depositing or by thermal oxidation. The dielectric layer 204 can be selected from a variety of dielectric materials. For example, the dielectric layer 204 can be formed from, but is not limited to, any one of silicon dioxide, a variation of silicon dioxide, silicon nitride, hydrogen silsesquioxane (HSQ), methyl silsesquioxane (MSQ), benzocyclobutene (BCB), fluorinated aromatic ether (FLARE), SILK®, NANOGLASS®, fluorinated glass (FSG) and BLACK DIAMOND®.

Figure 8:
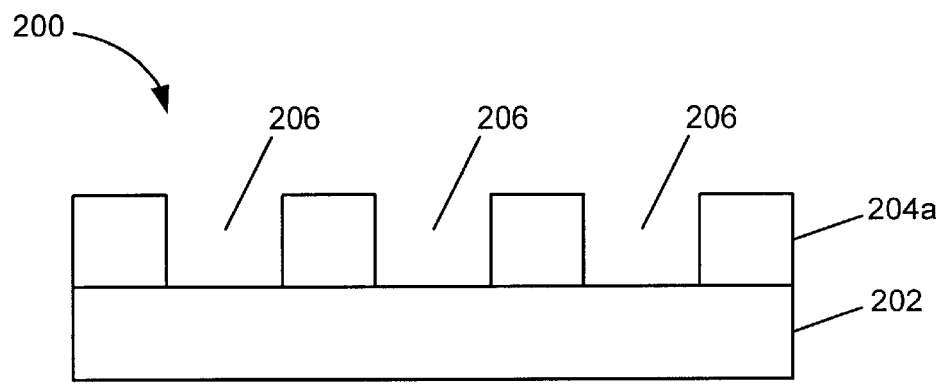

Once the dielectric layer 204 has been deposited the dielectric is patterned using techniques known in the art. For example, the dielectric layer 204 can be patterned by depositing thereon a suitable photoresist, patterning the photoresist to yield a mask and then using a wet etching process to remove at least one portion of the dielectric layer 204. Finally, the remaining photoresist mask is removed to yield the semiconductor chip 200 illustrated in FIG. 8 with the patterned dielectric layer 204a having openings 206 therein.

Figure 9:
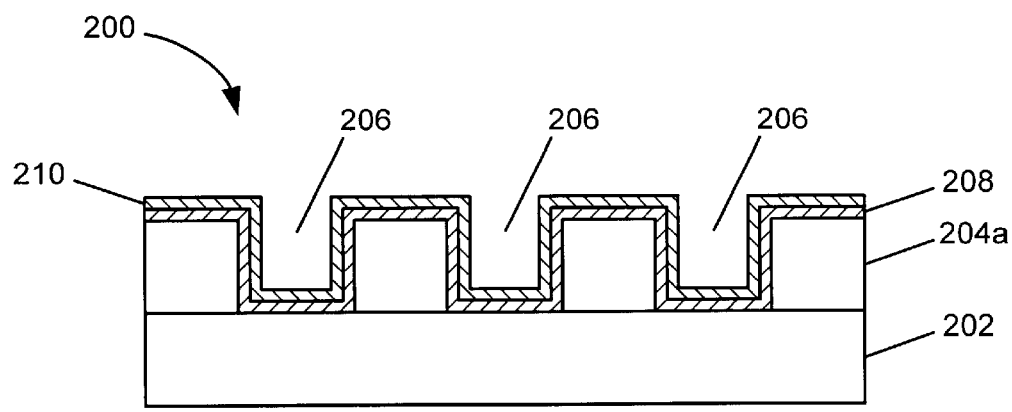

Referring to FIG. 9, a barrier layer 208 is deposited on the patterned dielectric layer 204a. The barrier layer 208 is deposited on the dielectric layer 204a to prevent eutectic alloying and diffusion from occurring in the semiconductor chip 200 due to a later deposited metal layer. Additionally, the barrier layer 208 serves to promote adhesion between later deposited layers (e.g., a copper seed layer 210) and the patterned dielectric layer 204a. Materials used for the barrier layer 208 can be selected from several materials known in the art for providing sufficient barrier and/or adhesion properties. The barrier materials include, but are not limited to, at least one of tantalum, tantalum nitride, tantalum silicide, tantalum carbide, titanium, titanium nitride, titanium silicide, titanium carbide, tungsten, tungsten nitride, tungsten silicide and tungsten carbide.

The barrier layer 208 may be deposited on the semiconductor chip 200 using several deposition techniques known in the art such as evaporation, chemical vapor deposition (CVD), plasma enhanced chemical vapor deposition (PECVD), physical vapor deposition (PVD), ion-metal plasma (IMP), hollow cathode magnetron (HCM) or self-ionized plasma (SIP).

In one embodiment, the barrier layer 208 is of suitable thickness in each of openings 206 to provide the desired protection to the areas of both the substrate and dielectric layers (layers 202 and 204a, respectively) underlying and adjacent to each of the openings 206. In another embodiment, the thickness of the barrier layer 208 in each of the openings 206 is from about 10 Å to about 150 Å, or from about 15 Å to about 120 Å, or even from about 25 Å to about 75 Å.

The next layer deposited on the semiconductor chip 200 is a copper seed layer 210. In one embodiment, the copper seed layer 210 is deposited because copper does not tend to adhere well to barrier metals. This is because oxides tend to form on top of the barrier layer 208 before copper can be electrochemically deposited on the barrier layer 208. The copper seed layer 210 is deposited on the barrier layer 208 to solve the problems associated with copper not adhering well to the barrier layer 208. Like the barrier layer 208, the copper seed layer 210 may be deposited on the semiconductor chip 200 using deposition techniques known in the art such as evaporation, PVD, IMP, HCM, SIP, CVD, or PECVD.

In one embodiment, the copper seed layer 210 is any desired thickness to provide the suitable adherence for a subsequent layer in each of the openings 206. In another embodiment, the copper seed layer 210 is at least about 50 Å thick on each of the exposed surfaces of the openings 206. Due to the methods used to produce the copper seed layer 210, the thickness thereof is not uniform. Accordingly, the above-mentioned thickness relates to the minimum thickness necessary at any given location within each opening 206. In another embodiment, the thickness of the copper seed layer 210 in each of the openings 206 is at least about 70 Å, or at least about 90 Å, or even at least about 120 Å. In still another embodiment, the thickness of the copper seed layer 210 in each of the openings 206 ranges from about 50 Å to about 175 Å, or from about 70 Å to about 150 Å, or from about 90 Å to about 125 Å, or even from about 70 to about 120 Å. It should be noted that the thickness of the copper seed layer 210 within each of the openings 206, or in opening to opening, need not be uniform so long as the minimum thickness is present in each of the openings 206.

Figure 10:
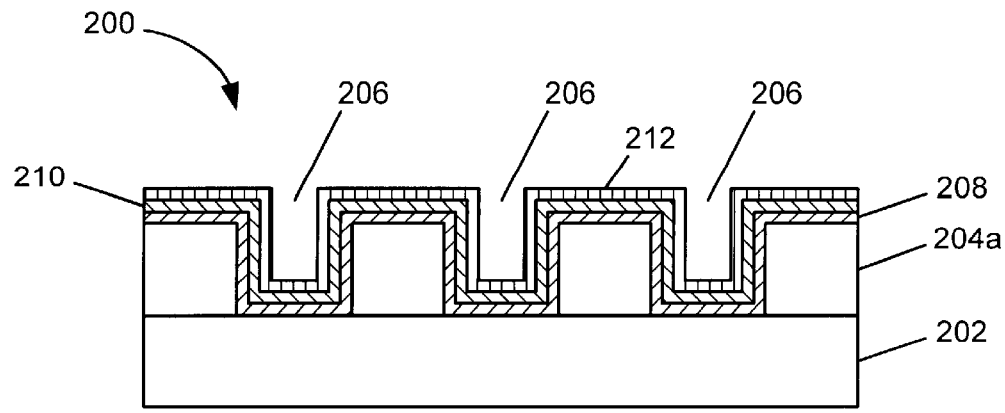

Next, as is illustrated in FIG. 10, the copper seed layer 210 is enhanced and/or repaired by the deposition of an enhancement layer 212. Generally, the enhancement layer 212 is formed from copper or a copper alloy.

The material used to form the enhancement layer 212 is deposited on the copper seed layer 210 via electroplating, electroless plating or CVD to yield, for example, a two layer copper structure (layers 210 and 212) having a minimum thickness within each of the openings 206 of at least about 200 Å, at least about 250 Å, or even at least about 300 Å. In another embodiment, the thickness of the combination of the copper seed layer 210 and the enhancement layer 212 within the each of the openings is in the range of about 200 Å to about 1,000 Å, or about 250 Å to about 900 Å, or even about 300 Å to about 800 Å.

For example, if the enhancement layer 212 is formed by electroplating the following process can be utilized. An enhancement layer 212 is electroplated on the semiconductor chip 200. The enhancement layer 212 acts to repair any defects in the copper seed layer 210, as well as supplementing the overall thickness of the copper seed layer 210.

In order to plate a metal (e.g., copper) on to the surface of an object, an electrolytic cell is typically used. Although not illustrated, the basic design of an electrolytic cell includes a cathode, an anode, a current source and an aqueous electrolyte. The aqueous electrolytic solution contains a dissolved metal such as copper. The cathode, which in this embodiment is the semiconductor chip 200, and the anode are immersed in the aqueous electrolytic solution. When current is provided to the electrolytic solution, by providing a charge across the anode and the cathode, the metal ions contained in the aqueous electrolytic solution are deposited on to the surface of the piece to be plated. The copper ions in the electrolytic solution are plated on the semiconductor chip 200 through electric migration and diffusion, and the amount of copper deposited over a period of time is controlled by the amount of current flowing in the electrolytic solution.

During the process of depositing the various layers of material on at least one portion of the substrate layer 202 and at least one portion of the patterned dielectric layer 204a, the wafer crystal structure of the substrate layer 202 may become damaged at various locations. Annealing processes improve the properties of the copper seed layer 210 and the enhancement layer 212, such as grain size, crystal orientation, stress and re-crystallization.

After the barrier layer 208, the copper seed layer 210, and the enhancement layer 212 are deposited, the semiconductor chip 200 is annealed. The annealing process is conducted in an ambient atmosphere of $N_2$ and/or forming gas (e.g., $N_2$ with about 0.5% to about 5% by volume $H_2$), in either a vacuum or furnace environment.

In one embodiment, the above annealing step is conducted at a temperature of about 75° C. to about 450° C., or 100° C. to about 400° C., or about 150° C. to about 350° C., or even about 750° C. to about 150° C. In one embodiment, the annealing process is continued for a suitable period of time to produce a copper film having the desired grain growth, strong <111> texture and low stress. This permits the later fabrication, via electroplating, of a copper layer 216 (see the discussion below with regard to FIG. 12) having a low stress. In one embodiment, the above annealing step is conduct for about 1 minute to about 120 minutes, or for about 5 minutes to about 60 minutes, or for about 1 minute to about 5 minutes, or even for about 5 minutes to about 30 minutes.

Figure 11:
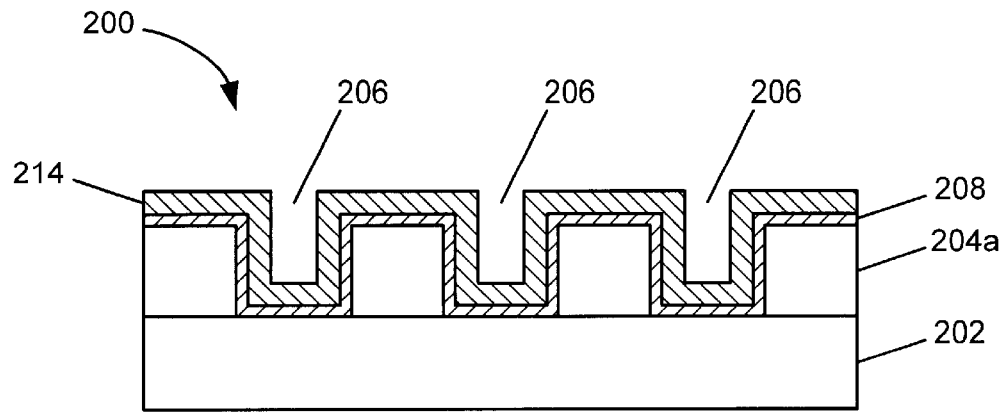

In one embodiment, the above annealing step causes the copper seed layer 210 and the enhancement layer 212 to anneal into an annealed layer 214 as illustrated in FIG. 11.

Figure 12:
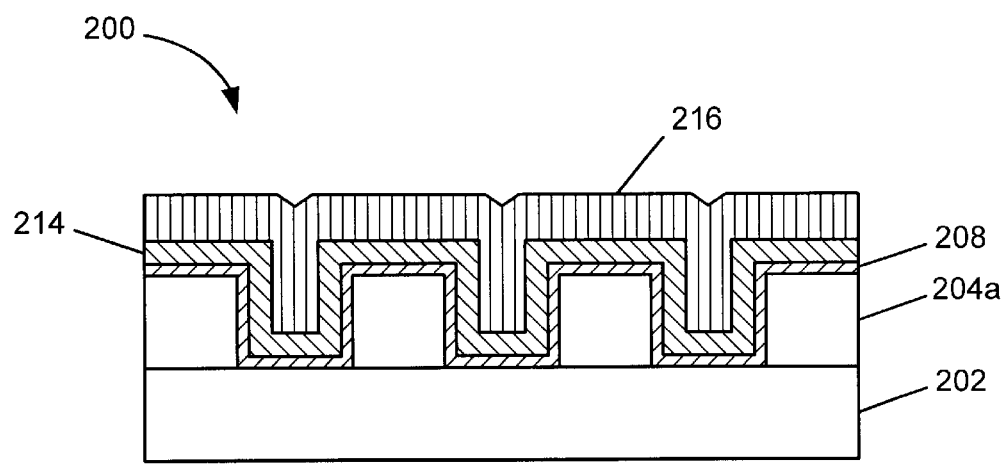

Next, as is illustrated in FIG. 12, the remainder of the openings 206 are filled (or even over filled) with a copper layer 216. The copper layer 216 can be deposited by via electroplating or electroless plating, as was discussed previously above. In one embodiment, the copper layer 216 is at least about 5,000 Å thick, or at about 7,500 Å thick, or even about 10,000 Å thick. In another embodiment, the copper layer 216 has a thickness in the range of about 1,000 Å to about 10,000 Å, or from about 2,000 Å to about 5,000 Å, or even from about 1,000 Å to about 3,000 Å.

After the copper layer 216 is deposited, the semiconductor chip 200 is annealed for a second time. The annealing process is conducted in an ambient atmosphere of $N_2$ and/or forming gas (e.g., $N_2$ with about 0.5% to about 5% by volume $H_2$), in either a vacuum or furnace environment.

In one embodiment, the above annealing step is conducted at a temperature of about 100° C. to about 400° C., or 150° C. to about 350° C., or even about 200° C. to about 300° C. In one embodiment, the annealing process is continued for a suitable period of time to produce a copper film having the desired grain growth, strong <111> texture and low stress. In one embodiment, the above annealing step is conduct for about 1 minute to about 120 minutes, or for about 5 minutes to about 60 minutes, or for about 1 minute to about 5 minutes, or even for about 5 minutes to about 30 minutes.

Figure 13:
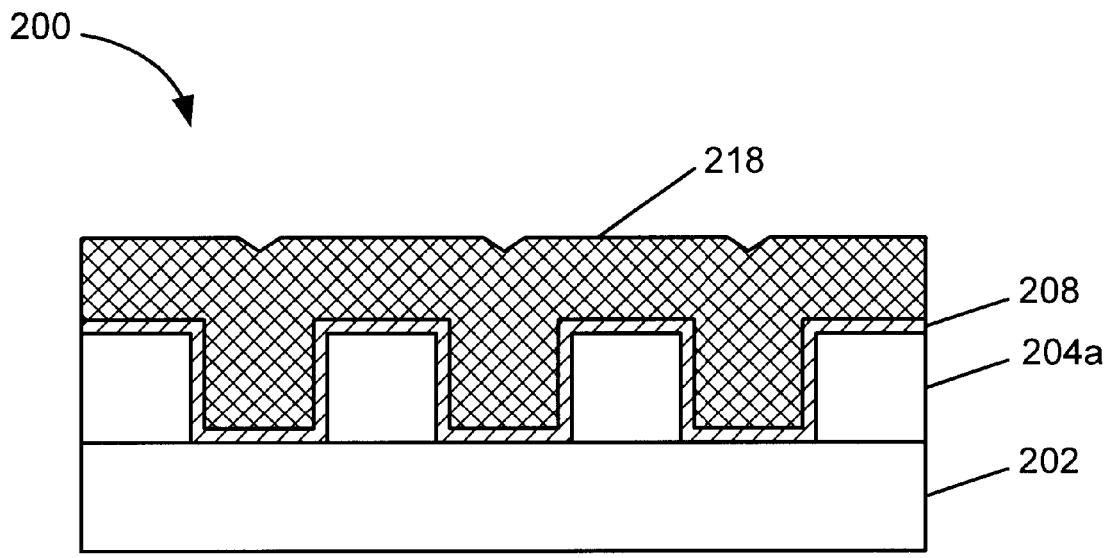

In one embodiment, the above annealing step causes the copper layer 216 and the annealed layer 214 to anneal into an annealed copper conductive layer 218. That is, generally in the first annealing step all of the copper seed layer 210 and the enhancement layer 212 are annealed into the annealed layer 214. Furthermore, generally in the second annealing step all of the annealed layer 214 and the copper layer 216 are annealed into the annealed copper conductive layer 218 as is illustrated in FIG. 13.

Figure 14:
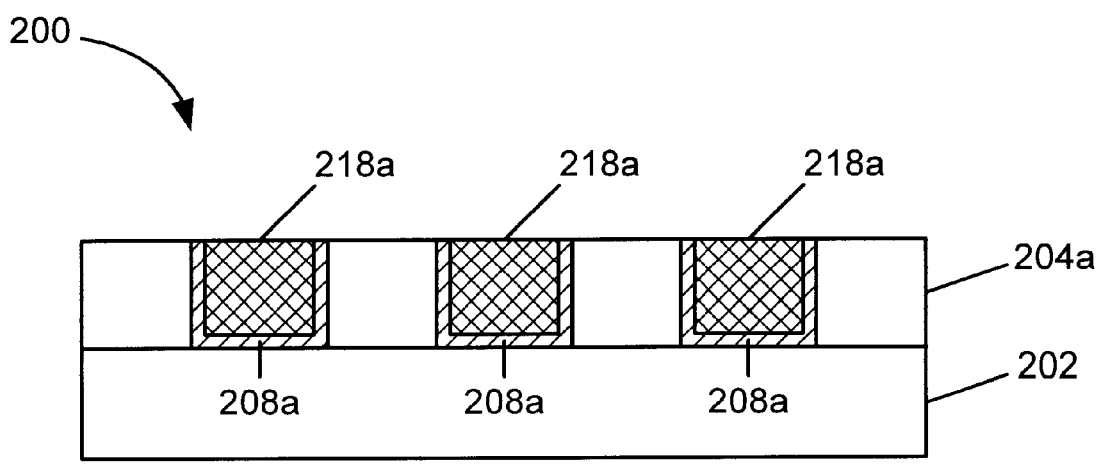

After the second annealing of the semiconductor 200 is complete, the next step in the present method is to remove at least the excess portions of the annealed copper conductive layer 218 and the barrier layer 208 over the remaining portions of the patterned dielectric layer 204a thereby leaving, for example, buried copper interconnects 218a which are bordered by a discrete or semi-discrete barrier layer 208a as is illustrated in FIG. 14. The portions of the annealed copper conductive layer 218 and the barrier layer 208 to be removed or planarized may be removed or planarized using methods known in the art such as chemical mechanical polishing (CMP). From here, the semiconductor 200 may be further processed as known to those in the art.

In another embodiment, one or more of the copper seed layer 210, the enhancement layer 212 and/or the copper layer 216 can be formed from a copper alloy. Such alloys are know in the art and include, but are not limited to, copper-silver alloys, copper-gold alloys, copper-platinum alloys, and copperpallidum alloys.

As previously stated, dual damascene manufacturing is a multi-level interconnection process and the present invention is applicable to dual damascene manufacturing as well.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming interconnects on a semiconductor chip, comprising the steps of:
   depositing a barrier layer and a copper seed layer on the semiconductor chip;
   depositing on the copper seed layer an enhancement layer;
   annealing the semiconductor chip a first time after the copper seed layer and the enhancement layer are deposited to form an annealed layer;
   electroplating a copper layer on the semiconductor chip; and
   annealing the semiconductor chip a second time at a temperature of about 100° C. to about 400° C. after the copper layer is deposited on the annealed layer to form an annealed copper conductive layer.

2. The method of claim 1, further including the step of planarizing the annealed copper conductive layer and the barrier layer.

3. The method of claim 1, wherein the copper seed layer has a thickness in the range of about 50 Å to about 175 Å.

4. The method of claim 1, wherein the enhancement layer is formed from copper.

5. The method of claim 1, wherein the total thickness of the copper seed layer and the enhancement layer is in the range of 200 Å to about 1,000 Å.

6. The method of claim 1, wherein the second annealing step is conducted in an ambient atmosphere of $N_2$ or a forming gas.

7. The method of claim 1, wherein the first annealing step is conducted at a temperature of about 75° C. to about 150° C.

8. A method of forming interconnects on a semiconductor chip, comprising the steps of:
   depositing a barrier layer and a copper seed layer on the semiconductor chip;
   depositing on the copper seed layer an enhancement layer;
   annealing the semiconductor chip a first time after the copper seed layer and the enhancement layer are deposited to form an annealed layer;
   electroplating a copper layer on the semiconductor chip;
   annealing the semiconductor chip a second time at a temperature of about 100° C. to about 400° C. after the copper layer is deposited on the annealed layer to form an annealed copper conductive layer; and
   planarizing the annealed copper conductive layer and the barrier layer,
   wherein at least one of the copper seed layer, the enhancement layer or the copper layer is composed of a copper alloy.

9. The method of claim 8, wherein the copper seed layer has a thickness in the range of about 50 Å to about 175 Å.

10. The method of claim 8, wherein the enhancement layer is formed from copper.

11. The method of claim 10, wherein the total thickness of the copper seed layer and the enhancement layer is in the range of 200 Å to about 1,000 Å.

12. The method of claim 8, wherein the first annealing step is conducted at a temperature of about 75° C. to about 150° C.

13. The method of claim 8, wherein the second annealing step is conducted in an ambient atmosphere of $N_2$ or a forming gas.

14. A method of forming interconnects on a semiconductor chip, comprising the steps of:

depositing a dielectric layer onto a substrate of the semiconductor chip;

patterning the dielectric layer to yield a patterned dielectric layer;

depositing a barrier layer and a copper seed layer on the patterned dielectric layer;

depositing on the copper seed layer an enhancement layer;

annealing the semiconductor chip a first time after the copper seed layer and the enhancement layer are deposited to form an annealed layer;

electroplating a copper layer on the semiconductor chip;

annealing the semiconductor chip a second time at a temperature of about 100° C. to about 400° C. after the copper layer is deposited on the annealed layer to form an annealed copper conductive layer; and removing at least one portion of the annealed copper conductive layer and the barrier layer that overlay the patterned dielectric layer.

15. The method of claim 14, wherein the copper seed layer has a thickness in the range of about 50 Å to about 175 Å.

16. The method of claim 14, wherein the enhancement layer is formed from copper.

17. The method of claim 16, wherein the total thickness of the copper seed layer and the enhancement layer is in the range of 200 Å to about 1,000 Å.

18. The method of claim 14, wherein the first annealing step is conducted at a temperature of about 75° C. to about 150° C.

19. The method of claim 14, wherein the second annealing step is conducted in an ambient atmosphere of $N_2$ or a forming gas.

* * * * *